United States Patent
Ito

(10) Patent No.: US 8,519,695 B2
(45) Date of Patent: Aug. 27, 2013

(54) POWER SUPPLY CIRCUIT HAVING ERROR AMPLIFIER

(75) Inventor: Yoshiaki Ito, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 374 days.

(21) Appl. No.: 12/911,095

(22) Filed: Oct. 25, 2010

(65) Prior Publication Data

US 2011/0095825 A1 Apr. 28, 2011

(30) Foreign Application Priority Data

Oct. 27, 2009 (JP) ................................ 2009-246029

(51) Int. Cl.
*G05F 3/16* (2006.01)

(52) U.S. Cl.
USPC .......................................... 323/316; 323/314

(58) Field of Classification Search
USPC ................................................ 323/312–317
See application file for complete search history.

(56) References Cited

U.S. PATENT DOCUMENTS

| | | | | |
|---|---|---|---|---|
| RE29,700 | E | * | 7/1978 | van de Plassche ............ 330/257 |
| 5,151,667 | A | * | 9/1992 | Nishijima .................. 331/117 R |
| 5,815,012 | A | * | 9/1998 | Rivoir et al. ................... 327/103 |
| 7,755,339 | B2 | * | 7/2010 | Kojima et al. ................. 323/280 |
| 2008/0079491 | A1 | * | 4/2008 | Yuasa ........................... 330/253 |
| 2008/0290941 | A1 | * | 11/2008 | Ludwig ......................... 330/253 |
| 2010/0102795 | A1 | * | 4/2010 | Sun et al. ...................... 323/313 |

FOREIGN PATENT DOCUMENTS

| | | |
|---|---|---|
| EP | 0 601 713 A1 | 5/1994 |
| JP | 6-232642 | 8/1994 |
| JP | 2002-50935 | 2/2002 |
| JP | 2006-166076 | 6/2006 |
| JP | 2006-238062 | 9/2006 |
| JP | 2006-262103 | 9/2006 |

OTHER PUBLICATIONS

International Search Report re application No. PCT/JP2010/068529, dated Jan. 25, 2011.
Written Opinion re application No. PCT/JP2010/068529, dated Jan. 25, 2011.
Rincon-Mora, G.A., "Power Management ICs: A Top-Down Design Approach," Short Course Slides, $3^{rd}$ Edition, Analog & Power IC Research Laboratory, School of Electrical and Computer Engineering, Georgia Institute of Technology, Jun. 11, 2006, pp. 17-22.

* cited by examiner

*Primary Examiner* — Adolf Berhane
*Assistant Examiner* — Emily Pham
(74) *Attorney, Agent, or Firm* — Husch Blackwell LLP

(57) ABSTRACT

One of the objects of the present invention is to suppress variations in the frequency response of a feedback circuit due to variations in the value of a passive element in an error amplifier. One of the embodiments of the present invention provides a configuration allowing the frequency response of a feedback circuit in an error amplifier to be determined by not only the value of a passive element but the gain of an active element. This error amplifier includes a voltage-to-current converter which is an active element. In addition, a first terminal, a second terminal, an operational amplifier, a first resistor, a second resistor, first to fifth transistors, a first current source, and a second current source can be built into an integrated circuit, and a capacitor can be externally provided.

25 Claims, 7 Drawing Sheets

POWER SUPPLY CIRCUIT HAVING ERROR AMPLIFIER

BACKGROUND OF THE INVENTION

1. Field of the Invention

The technical field relates to an error amplifier applicable to a power supply circuit (switching regulator) or the like.

2. Description of the Related Art

FIG. 4 shows an example of the configuration of a power supply circuit. The power supply circuit includes an error amplifier 40, an oscillator 50 which generates a triangle wave, a PWM (pulse width modulation) comparator 60, an inductor L1, a transistor Q6, a diode D1, a capacitor C3, and resistors R6 and R7.

The error amplifier 40 is an important component to determine the frequency response of a feedback circuit in a power supply circuit. An input voltage $V_{in}$ is input to an inverting input terminal of the error amplifier 40, and a reference voltage $V_{ref}$ is input to a non-inverting input terminal of the error amplifier 40.

The oscillator 50 is a circuit which generates a triangle wave $V_{osc}$ necessary for generating a PWM signal.

An output signal $V_{err}$ of the error amplifier 40 is input to the inverting input terminal of the PWM comparator 60, and the triangle wave $V_{osc}$ generated by the oscillator 50 is input to the non-inverting input terminal of the PWM comparator 60.

The PWM comparator 60 compares the output signal $V_{err}$ of the error amplifier 40 to the triangle wave $V_{osc}$. When the signal level of the triangle wave $V_{osc}$ is higher than that of the output signal $V_{err}$ of the error amplifier 40, an H (high-level) signal is output as a PWM signal to the transistor Q6. On the other hand, when the signal level of the triangle wave $V_{osc}$ is lower than that of the output signal $V_{err}$ of the error amplifier 40, an L (low-level) signal is output as a PWM signal to the transistor Q6.

One of the source and drain of the transistor Q6 is connected to one terminal of the inductor L1 and the anode of the diode D1. The other one of the source and drain of the transistor Q6 is connected to a reference potential (GND).

The other terminal of the inductor L1 is connected to a power input terminal 65.

The cathode of the diode D1 is connected to an output terminal 70. The capacitor C3 is connected in parallel with a series circuit of the resistors R6 and R7, between the output terminal 70 and GND. The voltage of a connection point between the resistors R6 and R7 is input as a feedback voltage $V_{fb}$ to the non-inverting input terminal of the error amplifier 40.

FIG. 3 shows an example of the configuration of a conventional error amplifier. A resistor R4 is connected between an input terminal 11 and an inverting input terminal of an operational amplifier 16. Moreover, a resistor R5 and a capacitor C2 are connected between an output terminal 12 and the inverting input terminal.

A transfer function representing a relation between an input signal and an output signal in this error amplifier is expressed by FORMULA 1.

$$V_{err} = V_{ref} - \frac{R_5}{R_4}\left(1 + \frac{1}{sR_5C_2}\right)(V_{in} - V_{ref}) \quad \text{[FORMULA 1]}$$

Patent Document 1 proposes an error amplifier in which a resistor and a capacitor are connected as phase compensators, between an output terminal and an inverting input terminal.

[Patent Document 1] Japanese Published Patent Application No. 2006-238062

SUMMARY OF THE INVENTION

From FORMULA (1), it is shown that in an error amplifier which includes a passive element such as a resistor and a capacitor, as shown in FIG. 3, the frequency response of the feedback circuit is determined by the value of the passive element.

However, the problem of designing a power supply circuit in an integrated circuit is that the frequency response of a feedback circuit is not determined to be a designed frequency response because the value of a passive element varies in a wide range. The frequency response of the feedback circuit can be determined to be a designed frequency response by making the resistor R4 variable, which is placed between the input terminal 11 and the inverting input terminal of the operational amplifier 16. However, it has been difficult to build a variable resistor in an integrated circuit, and hence it has been difficult to make an integrated error amplifier.

One of the objects of the present invention is to provide a configuration allowing the frequency response of a feedback circuit in an error amplifier to be determined by not only the value of a passive element but the gain of an active element.

One of the embodiments of the present invention is an error amplifier including a first resistor electrically connected between a first terminal and an inverting input terminal of an operational amplifier; a second resistor electrically connected between the inverting input terminal of the operational amplifier and an output terminal of the operational amplifier; a first transistor a gate of which is electrically connected between a second terminal and a non-inverting input terminal of the operational amplifier, and one of a source and drain of which is electrically connected to a first current source; a second transistor a gate of which is electrically connected to the output terminal of the operational amplifier, and one of a source and drain of which is electrically connected to the first current source; a third transistor one of a source and drain of which is electrically connected to the gate of the third transistor and to the other one of the source and drain of the second transistor, and the other one of the source and drain of which is electrically connected to a reference potential; a fourth transistor a gate of which is electrically connected to the gate of the third transistor, one of a source and drain of which is electrically connected to a second current source and a third terminal, and the other one of the source and drain of which is electrically connected to the reference potential; and a capacitor one terminal of which is electrically connected to the third terminal, and the other terminal of which is electrically connected to the reference potential.

The error amplifier can include a third resistor electrically connected between the third terminal and the one terminal of the capacitor.

In the error amplifier, the first terminal, the second terminal, the operational amplifier, the first resistor, the second resistor, the first to fourth transistors, the first current source, and the second current source can be built into an integrated circuit.

According to the present invention, it is possible to suppress variations in the frequency response of a feedback circuit due to variations in the value of a passive element in an error amplifier, and thus allows the error amplifier to be integrated.

DETAILED DESCRIPTION OF THE INVENTION

Embodiments of the invention disclosed will hereinafter be described with reference to the drawings. Note that the invention is not limited to the following description, and those skilled in the art can easily understand that modes and details of the invention can be changed in various ways without departing from the purpose and the scope of the invention. Therefore, it should be noted that the present invention should not be interpreted as being limited to the following description of the embodiments.

(Embodiment 1)

Figure 1:
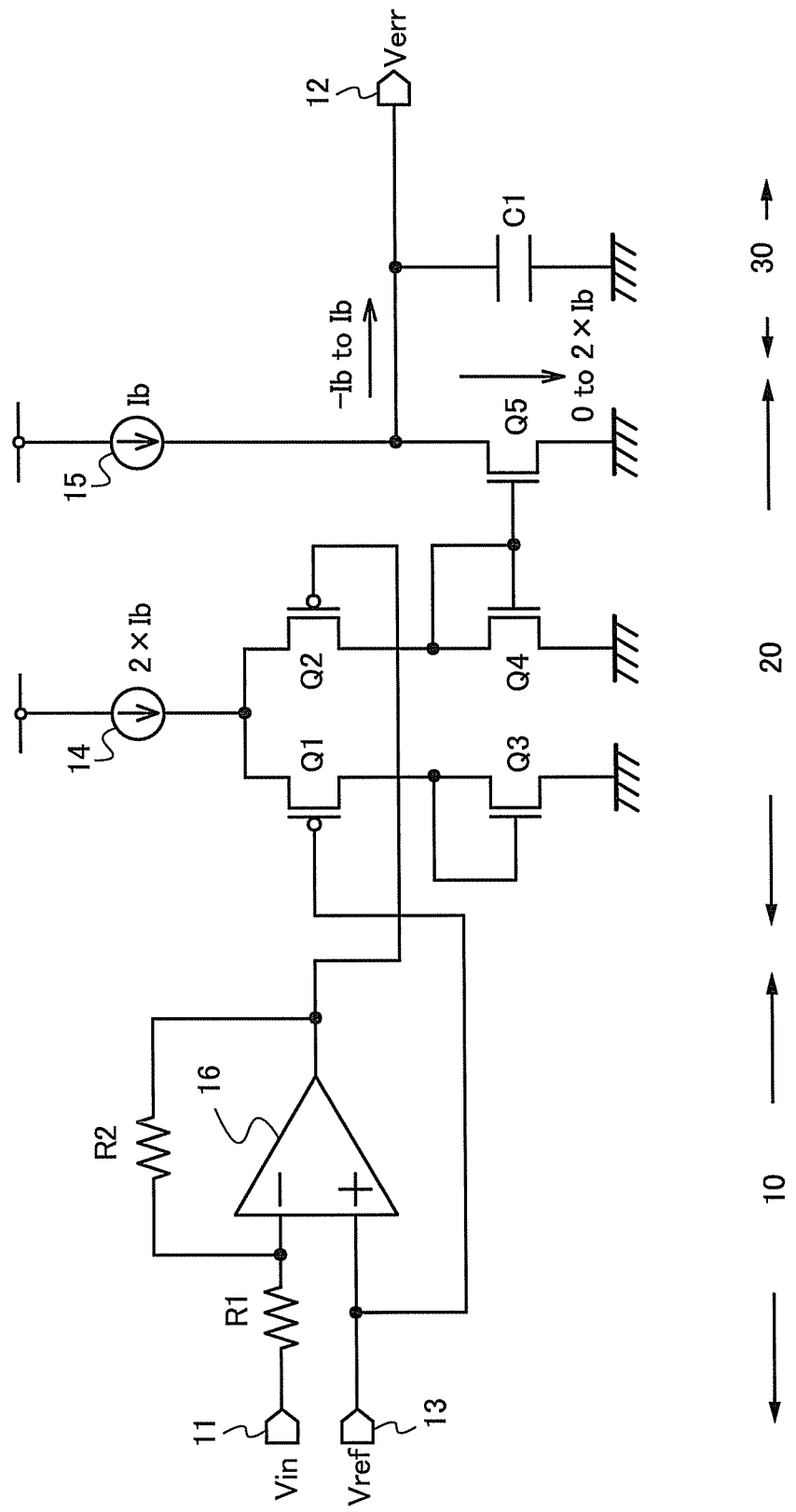
FIG. 1 is a circuit diagram of an error amplifier.

FIG. 1 shows a circuit diagram of an error amplifier according to this embodiment. The error amplifier includes an amplification stage 10, a voltage-to-current converter 20, and an integrator 30.

The amplification stage 10 includes the operational amplifier 16 and resistors R1 and R2. The resistor R1 is connected between the input terminal 11 and the inverting input terminal of the operational amplifier 16. Moreover, the resistor R2 is connected between an output terminal of the operational amplifier 16 and the inverting input terminal of the operational amplifier 16.

The voltage-to-current converter 20 includes PMOS transistors Q1 and Q2, and NMOS transistors Q3, Q4, and Q5 (such a "PMOS transistor" or "NMOS transistor" is hereinafter also simply referred to as a "transistor").

Here, the transistors are thin film transistors having a silicon channel layer. Note that the transistors are not limited to single gate transistors, and can be multi gate transistors such as double gate transistors.

Moreover, the channel layer of the transistors is not limited to a silicon layer, and can be an oxide semiconductor layer or the like.

The transistors $Q_1$ and $Q_3$ are connected in series to each other between a power source 14 and the reference potential GND. The transistors $Q_2$ and $Q_4$ are also directly connected in series to each other between the power source 14 and the reference potential GND.

Note that the reference potential GND is not limited to 0 V, and can be any potential as long as it can be used as a referential potential of the circuit.

A gate of the transistor $Q_1$ is connected between a terminal 13 to which the reference voltage $V_{ref}$ is input and the non-inverting input terminal of the operational amplifier 16.

A gate of the $Q_2$ is connected to the output terminal of the operational amplifier 16.

A gate of the transistor $Q_3$ is connected to a drain of the transistor $Q_3$.

A gate of the transistor $Q_4$ is connected to a drain of the transistor $Q_4$ and a gate of the transistor $Q_5$, i.e. the transistor $Q_4$ and the transistor $Q_5$ constitute a current mirror circuit.

The transistor $Q_5$ is connected between a power source 15 and the reference potential GND.

Note that the configuration of the voltage-to-current converter 20 is not limited to this. For example, the transistors $Q_1$ and $Q_2$ can be NMOS transistors. For another example, a passive element, such as a resistor, or another active element can be used instead of the transistor $Q_3$. In addition, the object can be achieved even when nothing is provided in the position of the transistor $Q_3$.

Figure 7:
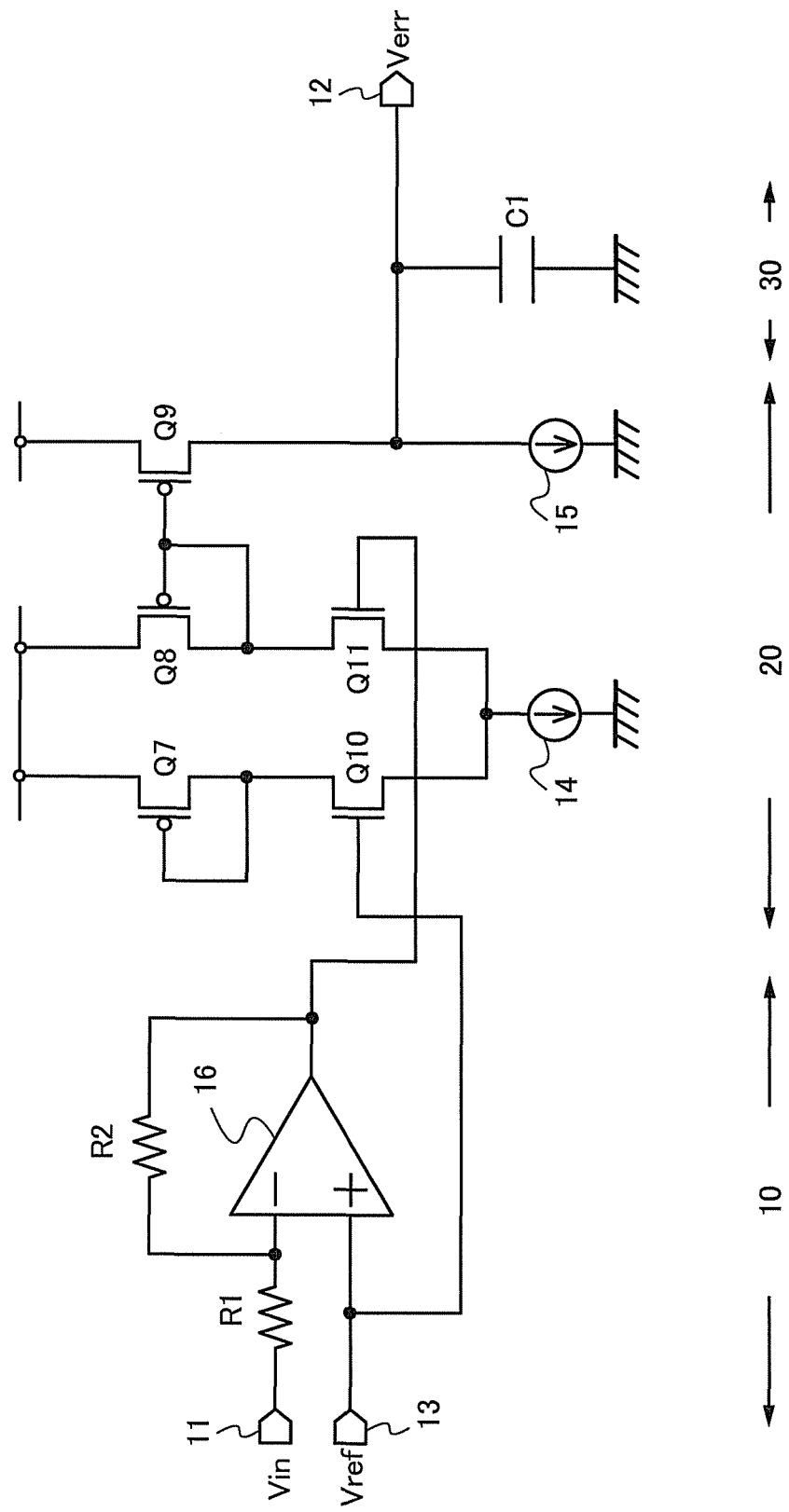
FIG. 7 is a circuit diagram of an error amplifier.

Moreover, in the voltage-to-current converter 20, transistors the conductivity type of which is opposite to that of the transistors in FIG. 1, as shown in FIG. 7. The voltage-to-current converter 20 shown in FIG. 7 includes transistors $Q_7$, $Q_8$, and $Q_9$, which are PMOS transistors, and transistors $Q_{10}$ and $Q_{11}$, which are NMOS transistors.

In this case also, the configuration of the voltage-to-current converter 20 is not limited to this. For example, the transistors $Q_{10}$ and $Q_{11}$ can be PMOS transistors. For another example, a passive element, such as a resistor, or another active element can be used instead of the transistor $Q_7$. In addition, the object can be achieved even when nothing is provided in the position of the transistor $Q_7$.

The integrator 30 shown in FIG. 1 and FIG. 7 includes a capacitor $C_1$.

The capacitor $C_1$ can be externally provided. By externally providing the capacitor $C_1$, the area of the integrated circuit can be reduced.

Figure 6:
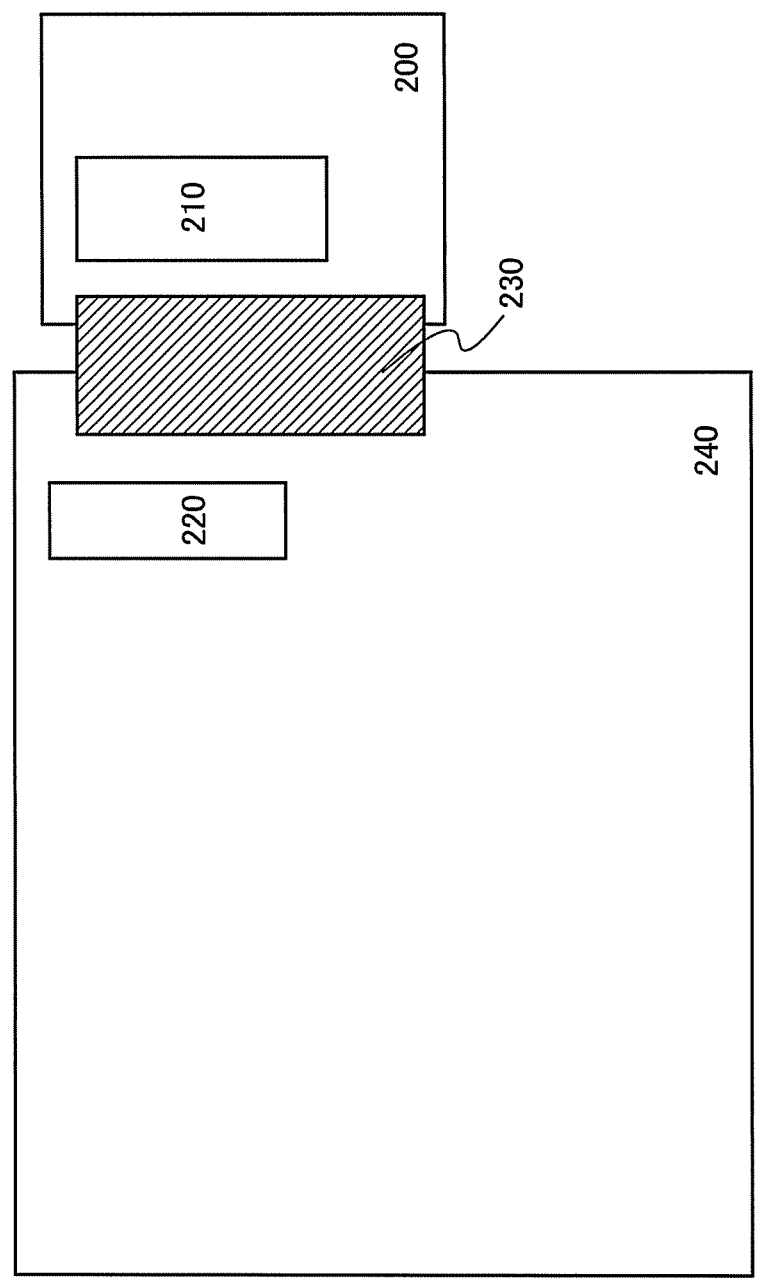
FIG. 6 shows a capacitor $C_1$ which is externally provided.

FIG. 6 shows a state where a chip 200 including a circuit of the error amplifier 210 is connected to a substrate 240 through an FPC 230. Here, the capacitor $C_1$ which is externally provided is placed in a region 220 included in the substrate 240.

Suppose that in the error amplifier of the present invention, a reference current Ib flows from the power source 15 to the output terminal 12. Then, the power source 14 can feed double the reference current Ib. The integrator 30 is formed using this output current and the capacitor $C_1$.

If the voltage gain of the voltage-to-current converter 20 is −A, a transfer function of this error amplifier is expressed by FORMULA 2.

$$V_{err} = \frac{1}{sC_1} \times A \times \frac{R_2}{R_1}(V_{in} - V_{ref}) \qquad \text{[FORMULA 2]}$$

From FORMULA 2, it is shown that the frequency response of the feedback circuit in this error amplifier can be optimized by varying the reference current of the voltage-to-current converter 20.

In other words, even if there are variations (manufacturing errors) in value between the capacitor $C_1$, the resistor $R_1$, and the resistor $R_2$, which are passive elements, a desired gain can be obtained by optimizing the value of A.

(Embodiment 2)

Figure 2:
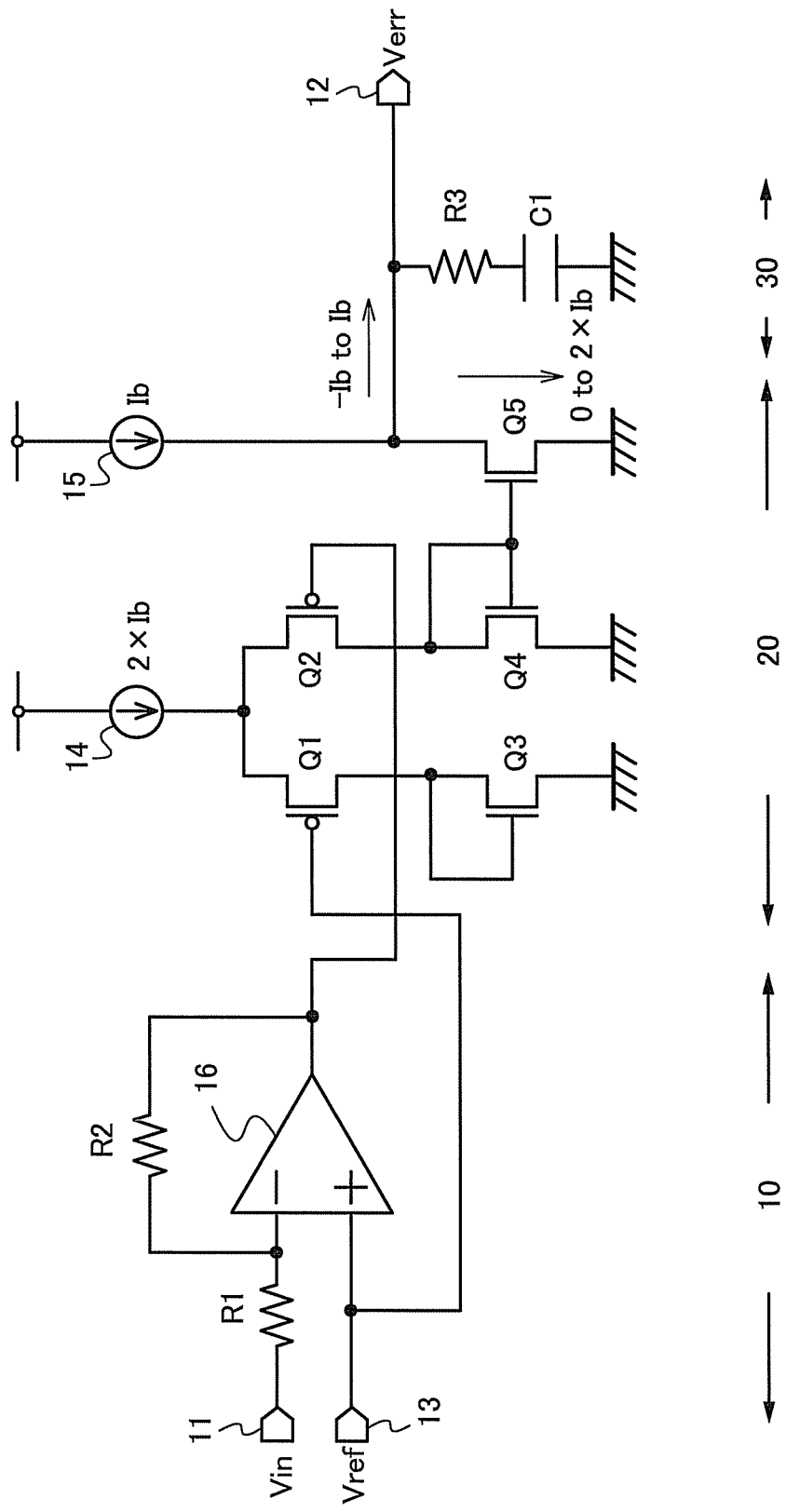
FIG. 2 is a circuit diagram of an error amplifier.
Figure 3:
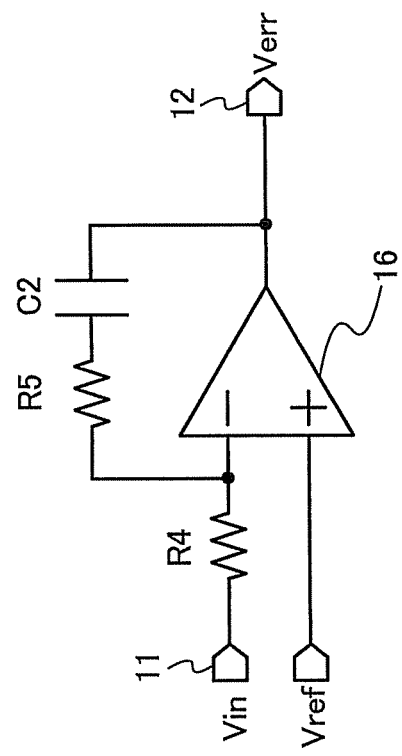
FIG. 3 is a circuit diagram showing an example of the configuration of a conventional error amplifier.
Figure 4:
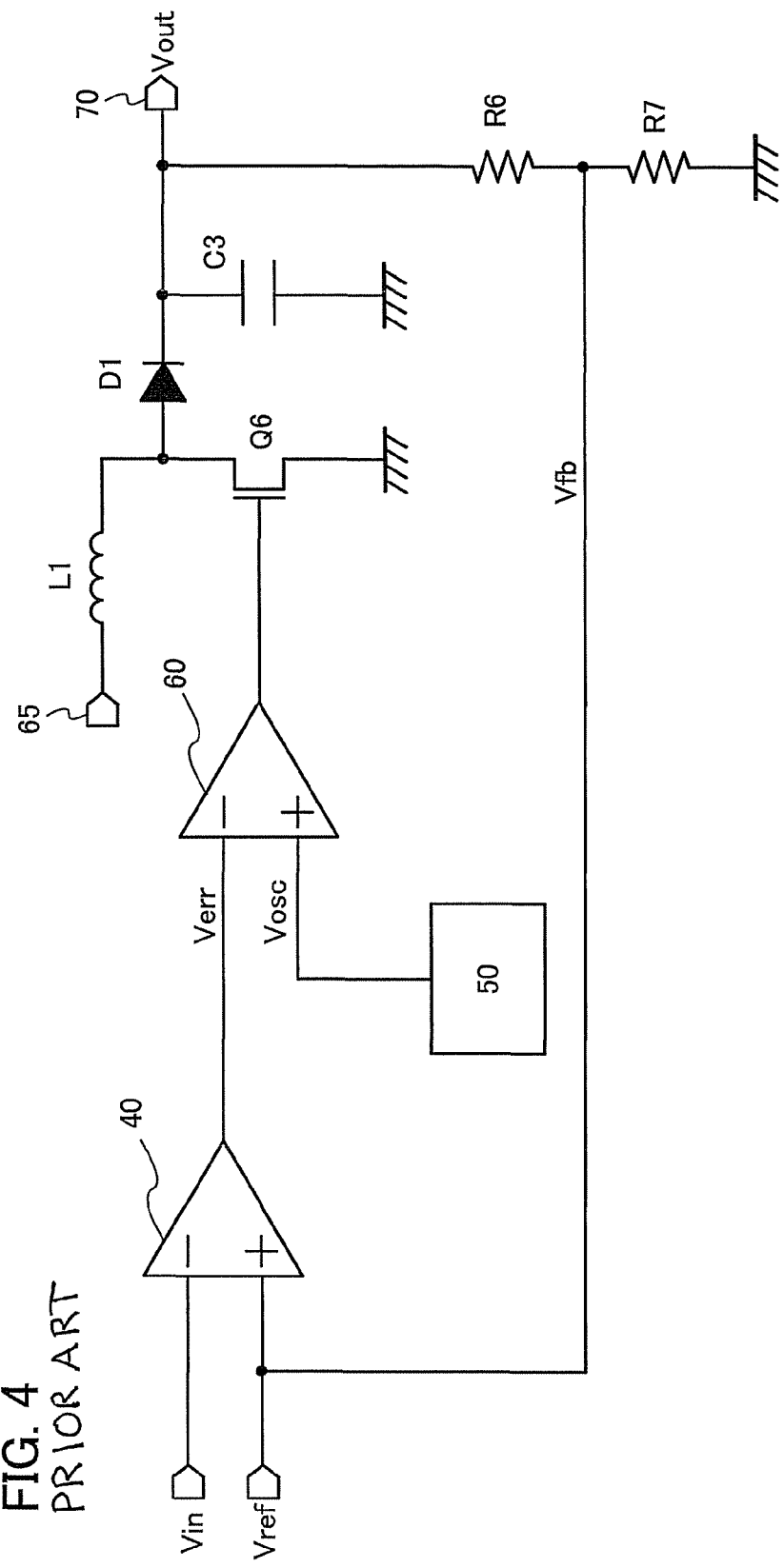
FIG. 4 is a circuit diagram showing an example of the configuration of a power supply circuit.

FIG. 2 shows a circuit diagram of an error amplifier according to this embodiment. This error amplifier is different from the error amplifier shown in FIG. 1 in that it has a resistor $R_3$ additionally provided in the integrator 30.

The resistor $R_3$ is a dumping resistor.

The integrator 30 can be externally provided as in Embodiment 1.

A transfer function of the error amplifier shown in FIG. 2 is expressed by FORMULA 3.

$$V_{err} = \left(R_3 + \frac{1}{sC_1}\right) \times A \times \frac{R_2}{R_1}(V_{in} - V_{ref}) \qquad \text{[FORMULA 3]}$$

Comparison between FORMULA 3 and FORMULA 2 shows that the addition of the resistor $R_3$, which is a phase compensator, increases a phase margin, thereby giving greater control over the optimization of the frequency response of the feedback circuit in the error amplifier.

(Embodiment 3)

Figure 5B:
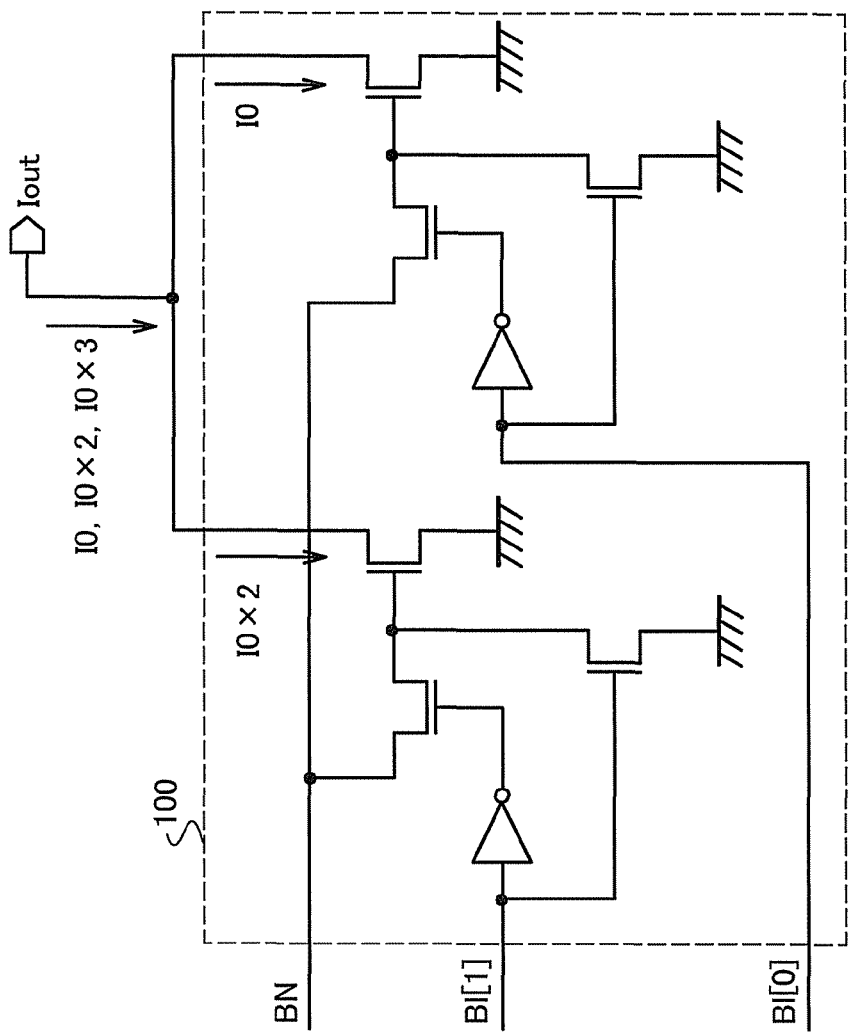
FIGS. 5A and 5B are circuit diagrams of a variable current source.
Figure 5A:
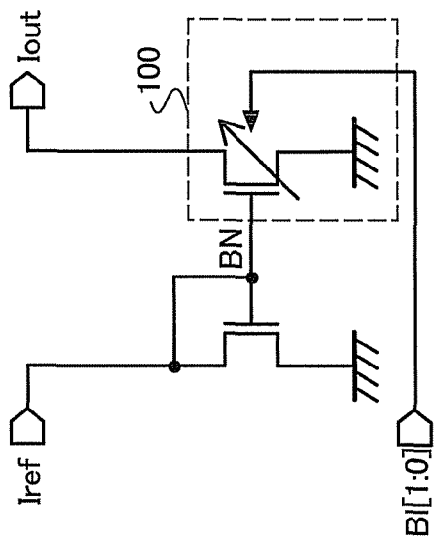

FIG. 5A shows an example of the configuration of a variable current source. FIG. 5B is a circuit diagram specifically showing a portion 100 shown in FIG. 5A. In FIG. 1 and FIG. 2, using the component in the portion 100 instead of the transistor Q5 can make the reference current Ib variable, which flows from the power source 15.

In the component in the portion 100 shown in FIG. 5B, bit signals B1 [1] and B1 [0] vary the number of transistors to be turned on, and thus vary the reference current. Note that the reference current output from Tout can be varied between $I_0$, $I_0 \times 2$, and $I_0 \times 3$.

Making the reference current variable facilitates the optimization of the frequency response of the feedback circuit in the error amplifier.

This application is based on Japanese Patent Application serial no. 2009-246029 filed with Japan Patent Office on Oct. 27, 2009, the entire contents of which are hereby incorporated by reference.

What is claimed is:

1. An error amplifier comprising:
   an amplification stage including an operational amplifier and first and second resistors;
   a voltage-to-current converter including at least first, second, third, and fourth transistors, a gate electrode of the second transistor being electrically connected to an output of the operational amplifier, and one of source and drain electrodes of the first transistor and one of source and drain electrodes of the second transistor being electrically connected to a first current source, respectively; and
   an integrator including a capacitor, one terminal of the capacitor being electrically connected to one of source and drain electrodes of the fourth transistor, a second current source, and an output terminal of the error amplifier,
   wherein a gate electrode of the fourth transistor being electrically connected to a gate electrode of the third transistor.

2. The error amplifier according to claim 1, wherein the amplification stage and the voltage-to-current converter are built into an integrated circuit.

3. The error amplifier according to claim 1, further comprising a third resistor in the integrator.

4. The error amplifier according to claim 1, further comprising first and second current sources in the voltage-to-current converter.

5. The error amplifier according to claim 1, wherein the first, second, third, and fourth transistors are thin film transistors, respectively.

6. The error amplifier according to claim 5, wherein a channel region of each of the thin film transistors comprises one of silicon and oxide semiconductor.

7. A power supply circuit having the error amplifier according to claim 1.

8. An error amplifier comprising:
   an amplification stage including an operational amplifier and first and second resistors;
      a voltage-to-current converter including at least first, second, third, and fourth transistors, one of source and drain electrodes of the first transistor and one of source and drain electrodes of the second transistor being electrically connected to a first current source, respectively, wherein the third and fourth transistors constitute a current mirror circuit; and
   an integrator including a capacitor, one terminal of the capacitor being electrically connected to one of source and drain electrodes of the fourth transistor, a second current source, and an output terminal of the error amplifier,
   wherein the other one of source and drain electrodes of the fourth transistor is electrically connected to a reference potential.

9. The error amplifier according to claim 8, wherein the amplification stage and the voltage-to-current converter are built into an integrated circuit.

10. The error amplifier according to claim 8, further comprising a third resistor in the integrator.

11. The error amplifier according to claim 8, further comprising first and second current sources in the voltage-to-current converter.

12. The error amplifier according to claim 8, wherein the first, second, third, and fourth transistors are thin film transistors, respectively.

13. The error amplifier according to claim 12, wherein a channel region of each of the thin film transistors comprises one of silicon and oxide semiconductor.

14. The error amplifier according to claim 8, wherein the first and second transistors are p-type transistors and the third and fourth transistors are n-type transistors.

15. The error amplifier according to claim 8, wherein the first and second transistors are n-type transistors and the third and fourth transistors are p-type transistors.

16. A power supply circuit having the error amplifier according to claim 8.

17. An error amplifier comprising:
   an amplification stage including an operational amplifier and first and second resistors,
   wherein the first resistor is electrically connected between a first terminal and an inverting input terminal of an operational amplifier, and
   wherein the second resistor is electrically connected between the inverting input terminal of the operational amplifier and an output terminal of the operational amplifier;
   a voltage-to-current converter including at least first, second, third, and fourth transistors,
   wherein a gate electrode of the first transistor is electrically connected between a second terminal and a non-inverting input terminal of the operational amplifier, and one of source and drain electrodes of the first transistor is electrically connected to a first current source,
   wherein a gate electrode of the second transistor is electrically connected to the output terminal of the operational amplifier, and one of source and drain electrodes of the second transistor is electrically connected to the first current source,
   wherein one of source and drain electrodes of the third transistor is electrically connected to a gate electrode of the third transistor and to the other one of the source and drain electrodes of the second transistor, and the other one of the source and drain electrodes of the third transistor is electrically connected to a reference potential, and
   wherein a gate electrode of the fourth transistor is electrically connected to the gate electrode of the third transistor, one of source and drain electrodes of the fourth transistor is electrically connected to a second current source and an output terminal of the error amplifier, and the other one of the source and drain electrodes of the fourth transistor is electrically connected to the reference potential; and
   an integrator including a capacitor, one terminal of the capacitor being electrically connected to the one of the source and drain electrodes of the fourth transistor and the output terminal of the error amplifier, and the other terminal of the capacitor being electrically connected to the reference potential.

18. The error amplifier according to claim 17, wherein the first terminal, the second terminal, the operational amplifier, the first resistor, the second resistor, the first to fourth transistors, the first current source, and the second current source are built into an integrated circuit.

19. The error amplifier according to claim 17, further comprising a third resistor being electrically connected between the output terminal of the error amplifier and the one terminal of the capacitor.

20. The error amplifier according to claim 8, wherein the operational amplifier, the first resistor, the second resistor, the first to fourth transistors, the first current source, and the second current source are built into an integrated circuit.

21. The error amplifier according to claim 17, wherein the first, second, third, and fourth transistors are thin film transistors.

22. The error amplifier according to claim 21, wherein channel layers of the thin film transistors comprise ne of silicon and oxide semiconductor.

23. The error amplifier according to claim 17, wherein the first and second transistors are p-type transistors and the third and fourth transistors are n-type transistors.

24. The error amplifier according to claim 17, wherein the first and second transistors are n-type transistors and the third and fourth t transistors are p-type transistors.

25. A power supply circuit having the error amplifier according to claim 17.

* * * * *